United States Patent
Srivastava et al.

(10) Patent No.: US 10,222,421 B1
(45) Date of Patent: Mar. 5, 2019

(54) METHOD FOR DETECTING FAULTS ON RETENTION CELL PINS

(71) Applicant: Silicon Laboratories Inc., Austin, TX (US)

(72) Inventors: Mudit Srivastava, Singapore (SG); Raghavendra Pai Kateel, Singapore (SG); Shantonu Bhadury, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/896,678

(22) Filed: Feb. 14, 2018

(51) Int. Cl.
| | |
|---|---|
| *G01R 31/3185* | (2006.01) |
| *G01R 31/10* | (2006.01) |
| *G01R 31/28* | (2006.01) |
| *G01R 31/3177* | (2006.01) |

(52) U.S. Cl.
CPC ..... *G01R 31/318541* (2013.01); *G01R 31/10* (2013.01); *G01R 31/2813* (2013.01); *G01R 31/3177* (2013.01); *G01R 31/318552* (2013.01); *G01R 31/318572* (2013.01)

(58) Field of Classification Search
CPC .... G01R 31/318541; G01R 31/318572; G01R 31/318552; G01R 31/2813; G01R 31/10; G01R 31/3177
See application file for complete search history.

(56) References Cited

U.S. PATENT DOCUMENTS

| | | |
|---|---|---|
| 5,422,852 A | 6/1995 | Houston et al. |
| 5,546,408 A | 8/1996 | Keller |
| 5,617,428 A * | 4/1997 | Andoh .......... G01R 31/318541 714/726 |
| 6,021,514 A * | 2/2000 | Koprowski .... G01R 31/318558 714/733 |
| 6,775,180 B2 | 8/2004 | Biyani et al. |
| 7,065,724 B2 | 6/2006 | Caty et al. |
| 7,091,766 B2 | 8/2006 | Ko et al. |

(Continued)

OTHER PUBLICATIONS

K. Shi, "Area and power-delay efficient state retention pulse-triggered flip-flops with scan and reset capabilities," 2008 IEEE International Conference on Computer Design, Lake Tahoe, CA, 2008, pp. 170-175.*

(Continued)

*Primary Examiner* — Cynthia Britt
(74) *Attorney, Agent, or Firm* — Egan Peterman Enders Huston

(57) ABSTRACT

Embodiments are disclosed for systems and methods that include pulsing a clock pin of retention cells included within a scan chain to shift a sequence of logic values into the scan chain, so that successive cells are loaded with opposite logic values. Embodiments also include pulsing a retain pin to retain the logic values, and pulsing the clock pin to shift the sequence of logic values through the chain, so that retained logic values are output from, and logic values opposite to the retained logic values are loaded into, the cells. Embodiments also include pulsing a restore pin to restore the retained logic values, pulsing the clock pin to shift the logic values out of the scan chain, comparing the logic values shifted out of the scan chain with the logic values shifted into the scan chain, and detecting a fault on the retain pin based on said comparison.

20 Claims, 7 Drawing Sheets

(56) References Cited

U.S. PATENT DOCUMENTS

| | | | |
|---|---|---|---|
| 7,123,068 | B1 | 10/2006 | Hoover et al. |
| 7,138,842 | B2 | 11/2006 | Padhye et al. |
| 7,164,301 | B2 | 1/2007 | Chun |
| 7,183,825 | B2 | 2/2007 | Padhye et al. |
| 7,596,737 | B2 | 9/2009 | Wang et al. |
| 7,886,263 | B1* | 2/2011 | Thirunavukarasu ............ G01R 31/318583 716/119 |
| 8,271,226 | B2 | 9/2012 | Chakravadhanula et al. |
| 8,296,703 | B1 | 10/2012 | Chakravadhanula et al. |
| 8,418,008 | B2* | 4/2013 | Chakravarty .. G01R 31/318552 714/726 |
| 2007/0226568 | A1* | 9/2007 | Anzou ............ G01R 31/31721 714/733 |
| 2008/0195346 | A1* | 8/2008 | Lin ................ G01R 31/318575 702/119 |
| 2014/0245252 | A1* | 8/2014 | Chan ............. G01R 31/318575 716/136 |
| 2017/0193155 | A1 | 7/2017 | Lin et al. |
| 2018/0074122 | A1* | 3/2018 | Payne ................ G01R 31/3177 |

OTHER PUBLICATIONS

S. Yang, B. M. Al-Hashimi, D. Flynn and S. Khursheed, "Scan based methodology for reliable state retention power gating designs," 2010 Design, Automation & Test in Europe Conference & Exhibition (Date 2010), Dresden, 2010, pp. 69-74.*

H. Karimiyan, S. M. Sayedi and H. Saidi, "Low-power dual-edge triggered state-retention scan flip-flop," in IET Computers & Digital Techniques, vol. 4, No. 5, pp. 410-419, Sep. 2010.*

Tessent FastScan, Automatic Test Pattern Generation; DataSheet, 2 pgs. (2017).

Prasad et al., "UPF Generic References; Unleashing the Full Potential", DVCon US, 10 pgs. (2016).

* cited by examiner

| Retention Cell | 12 | 11 | 10 | 9 | 8 | 7 | 6 | 5 | 4 | 3 | 2 | 1 |
|---|---|---|---|---|---|---|---|---|---|---|---|---|
| TEST_IN | 0 | 1 | 0 | 1 | 0 | 1 | 0 | 1 | 0 | 1 | 0 | 1 |
| OUT | 0 | 0 | 0 | 0 | 0 | 0 | 0 | 0 | 0 | 0 | 0 | 0 |

*FIG. 5a*

| Retention Cell | 12 | 11 | 10 | 9 | 8 | 7 | 6 | 5 | 4 | 3 | 2 | 1 |
|---|---|---|---|---|---|---|---|---|---|---|---|---|
| TEST_IN | 1 | 0 | 1 | 0 | 1 | 0 | 1 | 0 | 1 | 0 | 1 | 0 |
| OUT | 0 | 1 | 0 | 1 | 0 | 0 | 0 | 1 | 0 | 1 | 0 | 0 |

*FIG. 5b*

| Retention Cell | 12 | 11 | 10 | 9 | 8 | 7 | 6 | 5 | 4 | 3 | 2 | 1 |
|---|---|---|---|---|---|---|---|---|---|---|---|---|
| TEST_IN | 1 | 0 | 1 | 0 | 1 | 0 | 1 | 0 | 1 | 0 | 1 | 0 |
| OUT | 1 | 1 | 1 | 0 | 1 | 0 | 0 | 0 | 1 | 1 | 1 | 0 |

*FIG. 5c*

METHOD FOR DETECTING FAULTS ON RETENTION CELL PINS

BACKGROUND

1. Field of the Disclosure

This disclosure relates to methods for testing integrated circuits (ICs) and, more particularly, to methods for detecting faults on one or more pins of one or more retention cells included within an IC.

2. Description of the Relevant Art

The following descriptions and examples are provided as background only and are intended to reveal information that is believed to be of possible relevance to the present disclosure. No admission is necessarily intended, or should be construed, that any of the following information constitutes prior art impacting the patentable character of the subject matter claimed herein.

The need for low power electronics has driven integrated circuit (IC) manufacturers to reduce power consumption and enhance battery life, in one respect, by powering down one or more circuits of an IC chip. For example, power consumption can be reduced by powering down circuits on an IC chip when an electronic device enters a sleep mode. When the central processing unit (CPU) of an electronic device enters a sleep mode, all peripheral trigger sources (such as $I^2C$, timer, etc.) are retained, so that in the case of communication with a peripheral device, the CPU can restore normal operation when it comes out of sleep mode. As another example, IC chips having multiple power domains can eliminate static and dynamic power dissipation in inactive power domains by selectively powering down the inactive power domains.

State retention cells, otherwise referred to as state retention power gating (SRPG) cells or simply retention cells, are often included on IC chips to retain state values (or logic values) of powered down circuitry/domains, and to ensure that the circuitry/domains are restored to the retained state values when power is reapplied to the circuitry/domains. Retention cells generally include retention elements and functional elements. Retention elements (e.g., a flip-flop or latch) retain the current state value of circuitry associated with the retention cell when power is removed from the circuitry. When power is reapplied to the circuitry, the state value retained within the retention element is restored to the circuitry via the functional element (e.g., another flip-flop or latch) of the retention cell. In this manner, the use of retention cells is to restore the powered down circuitry to the previous known/correct state prior to power down.

Retention cells must be tested during manufacturing of the IC chip to ensure that the retention cells are functioning correctly. For example, retention cells are tested to determine if they are capable of retaining state values when power is removed from associated circuits, and capable of restoring the retained state values once power is reapplied. These tests, otherwise called state retention tests, generally involve loading a scan test pattern (i.e., a sequence of logic values) into a scan chain of retention cells while power is supplied to the associated circuitry, removing power from the associated circuitry for a period of time, retaining the logic values loaded into the retention cells, performing a power up sequence to reapply power to the circuitry, restoring the retained logic values in the retention cells, and unloading the scan chains. Any errors detected while comparing the unloaded values with the loaded values will indicate problems with the retention cells.

State retention tests are typically performed by Automatic Test Pattern Generation (ATPG) tools, which produce manufacturing test vectors (i.e., scan test patterns) for IC designs. ATPG tools rely on dedicated ATPG libraries to generate the scan test patterns used to test retention cells and other modules of IC designs. These dedicated libraries include ATPG models for various modules of the IC design, and are often generated manually from a source design library. The manual generation of ATPG models is time consuming and error prone, and ATPG models are typically not verified until the silicon process for a new IC design is complete. Therefore, it may take a substantially long time to generate and run an ATPG model for a new IC design.

Conventional ATPG tools are known to provide ATPG models for testing the retention and restore capabilities of state retention cells by providing scan test patterns and performing a state retention test (i.e., a power cycling based state retention test) as generally described above. As such, conventional ATPG tools provide test methods for testing the functional behavior of retention cells. However, conventional ATPG models for testing retention cells often fail to include, or provide accurate detection of, structural defects or static faults on one or more pins of a retention cell. A "stuck-at fault" is one example of a structural defect on a node or pin that is shorted to (i.e., stuck at) another node or pin, thereby causing the shorted node or pin to be "stuck at" a particular logic value (e.g., a logic 1 or logic 0 value). Failure to accurately detect structural defects, such as stuck-at faults, reduces the fault coverage of the ATPG model. As such, a need exists for increasing ATPG fault coverage by providing an improved test method for accurately detecting faults on one or more pins of retention cells.

SUMMARY

The following description of various embodiments of computer-readable storage mediums and methods for testing retention cells is not to be construed in any way as limiting the subject matter of the appended claims.

Generally speaking, the present disclosure provides various embodiments of test methods for detecting faults on one or more pins of one or more retention cells included within a scan chain. A retention cell generally includes a functional latch, a retention latch, a retain pin, a restore pin and a clock pin. Although some retention cell designs use a single pin for retention and restore, the test method embodiments disclosed herein are preferably applied to retention cells having separate retain and restore pins. As set forth in more detail below, embodiments of the disclosed test methods may be used to accurately detect stuck-at 1 faults on retain pins and stuck-at 0 faults on restore pins of the retention cells of a scan chain. In some embodiments, retention cells and non-retention cells may be coupled together in a mixed scan chain. In such embodiments, the retention cells in the mixed scan chain may be identified at the start of the test method.

According to one embodiment, the test method disclosed herein may include pulsing the clock pin of the retention cells to shift a sequence of logic values into the scan chain, so that successive retention cells are loaded with opposite logic values. In particular, a number of pulses may be supplied to the clock pins of the retention cells to load logic values within the functional latches of all retention cells in the scan chain. In one example, the sequence of logic values shifted into the scan chain may be a scan test pattern of alternating 1's and 0's (e.g., '101010 . . . ' or '010101 . . . '). Next, the test method may include pulsing the retain pin of the retention cells to retain the logic values within the retention latches of the retention cells, and pulsing the clock pin of the retention cells to shift the sequence of logic values through the scan chain. More specifically, one additional pulse may be supplied to the clock pins of the retention cells to output the retained logic values from, and load logic values opposite to the retained logic values into, the functional latches of the retention cells.

After pulsing the clock pin of the retention cells to shift the sequence of logic values through the scan chain, some embodiments of the test method may include comparing the logic values output from the retention cells with the logic values shifted into the scan chain at each bit location. In some cases, the test method may include detecting a stuck-at 0 fault on the restore pin of a retention cell, if the logic value output from the retention cell does not equal the logic value shifted into the scan chain at the bit location corresponding to the retention cell.

The test method described herein further includes pulsing the restore pin of the retention cells to restore the retained logic values within the functional latches of the retention cells, and pulsing the clock pin of the retention cells to shift the sequence of logic values out of the scan chain. In particular, a number of pulses may be supplied to the clock pins of the retention cells to shift the sequence of logic values out the scan chain.

Some embodiments of the test method disclosed herein include comparing the sequence of logic values shifted out of the scan chain with the sequence of logic values shifted into the scan chain, and detecting a fault on the retain pin of one or more retention cells based on said comparison. For example, each bit location within the sequence of logic values may correspond to a different retention cell within the scan chain. In a mixed scan chain embodiment, bit locations within the sequence of logic values corresponding to non-retention cells may be ignored. In some embodiments of the disclosed test method, the logic values shifted out of the scan chain may be compared with the logic values shifted into the scan chain at each bit location, and a stuck-at 1 fault may be detected on the retain pin of a retention cell, if the logic value shifted out of the scan chain is equal to the logic value shifted into the scan chain at the bit location corresponding to the retention cell.

According to another embodiment, a computer-readable storage medium is provided herein for storing a plurality of program instructions, which are executable by a processing device for performing the test method. In some embodiments, the computer-readable storage medium may be coupled to transmit the plurality of program instructions to an Automatic Test Pattern Generator (ATPG) tool. The ATPG tool may include the processing device, which is configured to execute the plurality of program instructions for testing the retention cells.

The storage medium may include first program instructions executable for pulsing the clock pin of the retention cells to shift a sequence of logic values into the scan chain, so that successive retention cells are loaded with opposite logic values. More specifically, the first program instructions may include one or more program instructions executable for supplying a number of pulses to the clock pins of the retention cells to load logic values within the functional latches of all retention cells in the scan chain.

The storage medium may further include second program instructions executable for pulsing the retain pin of the retention cells to retain the logic values loaded into the retention cells. More specifically, the second program instructions may include one or more program instructions executable for supplying a pulse to the retain pins of the retention cells to retain the logic values within the retention latches of the retention cells.

The storage medium may further include third program instructions executable for pulsing the clock pin of the retention cells to shift the sequence of logic values through the scan chain. More specifically, the third program instructions may include one or more program instructions executable for supplying one additional pulse to the clock pins of the retention cells to output the retained logic values from, and load logic values opposite to the retained logic values into, the functional latches of the retention cells.

The storage medium may further include fourth program instructions executable for pulsing the restore pin of the retention cells to restore the retained logic values within the retention cells. More specifically, the fourth program instructions may include one or more program instructions executable for supplying a pulse to the restore pins of the retention cells to restore the retained logic values within the functional latches of the retention cells.

The storage medium may further include fifth program instructions executable for pulsing the clock pin of the retention cells to shift the sequence of logic values out of the scan chain. More specifically, the fifth program instructions may include one or more program instructions executable for supplying a number of pulses to the clock pins of the retention cells to shift the sequence of logic values out the scan chain.

The storage medium may further include sixth program instructions executable for comparing the sequence of logic values shifted out of the scan chain with the sequence of logic values shifted into the scan chain. For example, each bit location within the sequence of logic values may correspond to a different retention cell within the scan chain. As such, the sixth program instructions may include one or more program instructions executable for comparing the logic values shifted out of the scan chain with the logic values shifted into the scan chain at each bit location. In a mixed scan chain embodiment, bit locations corresponding to non-retention cells may be ignored in the comparison.

The storage medium may further include seventh program instructions executable for detecting a fault on the retain pin of one or more retention cells based on said comparison. More specifically, the seventh program instructions may include one or more program instructions executable for detecting a stuck-at 1 fault on the retain pin of a retention cell if the logic value shifted out of the scan chain is equal to the logic value shifted into the scan chain at the bit location corresponding to the retention cell.

In some embodiments, the storage medium may further include eighth program instructions executable for comparing the logic values, which were output from the retention cells upon execution of the third program instructions, with the logic values shifted into the scan chain at each bit location, and ninth program instructions executable for detecting a fault on the restore pin of one or more retention cells based on said comparison. More specifically, the ninth program instructions may include one or more program instructions executable for detecting a stuck-at 0 fault on the restore pin of a retention cell, if the logic value output from the retention cell upon execution of the third program instructions does not equal the logic value shifted into the scan chain at the bit location corresponding to the retention cell.

BRIEF DESCRIPTION OF THE DRAWINGS

Other objects and advantages of the disclosure will become apparent upon reading the following detailed description and upon reference to the accompanying drawings.

FIG. 5a is a graphical representation of example logic values provided at the TEST_IN and OUT pins of a plurality of retention cells at the first clock pulse step shown in FIG. 3;

FIG. 5b is a graphical representation of example logic values provided at the TEST_IN and OUT pins of a plurality of retention cells at the second clock pulse step shown in FIG. 3;

FIG. 5c is a graphical representation of example logic values provided at the TEST_IN and OUT pins of a plurality of retention cells at the third clock pulse step shown in FIG. 3.

Figure 1:
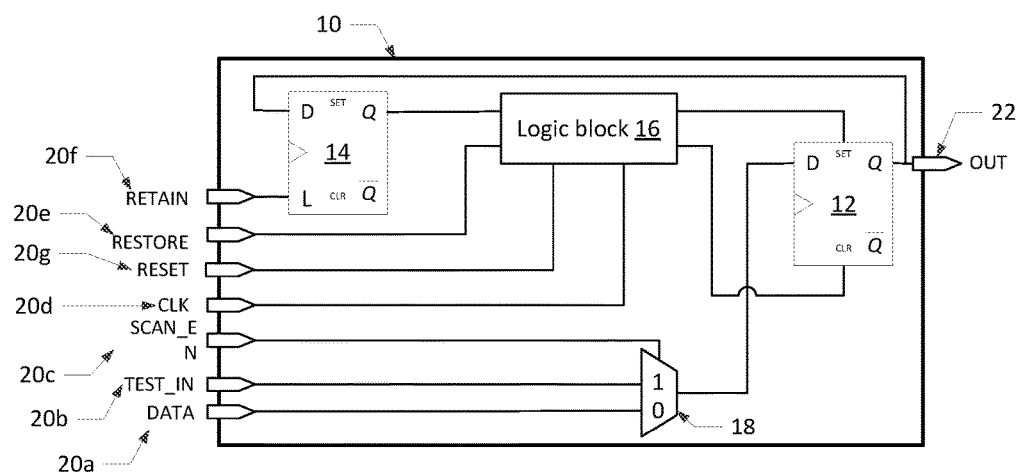
FIG. 1 is a block diagram illustrating an example retention cell having a functional latch, a retention latch, and a plurality of pins including at least a retain pin, a restore pin and a clock pin.

While the embodiments disclosed herein are susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the disclosure is intended to cover all modifications, equivalents and alternatives falling within the spirit and scope of the present disclosure as defined by the appended claims.

DETAILED DESCRIPTION OF PREFERRED EMBODIMENTS

Generally speaking, the present disclosure provides various embodiments of methods for testing integrated circuits (ICs), more specifically for testing IC designs including state retention cells (hereinafter referred to as retention cells). In particular, the present disclosure provides embodiments of an improved test method and associated program instructions for accurately detecting stuck-at faults on one or more retention related pins of one or more retention cells provided on an IC. As set forth below, embodiments of the improved test method may first identify the retention cells, thereby enabling the test method disclosed herein to be performed on retention cells included within a mixed scan chain of retention cells (RCs) and non-retention cells (NRCs). Alternative embodiments of the test method, which may not include an identifying step, may still be used for detecting stuck-at faults on one or more pins of one or more retention cells when retention cells and non-retention cells are provided within separate scan chains.

As noted above, retention cells are often included in integrated circuits (ICs) to retain state values (or logic values) of powered down circuitry and/or power domains on the IC, and to ensure that the circuitry/domains are restored to the retained state values when power is subsequently reapplied to the circuitry/domains. As such, retention cells generally include a functional element (e.g., a flip-flop or latch) for propagating state values to associated circuitry, and a retention element (e.g., another flip-flop or latch) for retaining the current state value of the associated circuitry when power is removed from the circuitry and from the functional element of the retention cell. When power is reapplied to the circuitry, the state value retained within the retention element is restored within the functional element of the retention cell and forwarded to the circuitry. In this manner, retention cells enable powered down circuitry to be restored to a known/correct state when power is turned back on.

FIG. 1 illustrates a block diagram showing one example of a retention cell 10 including a functional latch 12, a retention latch 14, a logic block 16, and a multiplexer 18. In the illustrated embodiment, functional latch 12 and retention latch 14 are each implemented with D-type flip-flops. It is noted, however, that functional latch 12 and retention latch 14 are not strictly limited to D-type flip-flops, and may be implemented with other types of flip-flops or latches (e.g., SR-type, JK-type and/or T-type flip-flops) in other retention cell embodiments.

Retention cell 10 also includes a plurality of input and output pins 20/22. In the illustrated example, retention cell 10 includes a DATA pin 20a coupled to receive a data value from circuitry associated with the retention cell during non-test times (e.g., a data value corresponding to a current state value of the associated circuitry), a TEST_IN pin 20b coupled to receive a scan test pattern value provided by an Automatic Test Pattern Generation (ATPG) tool during test times, and a SCAN_EN pin 20c coupled to receive a scan enable signal to enter a scan test mode and initiate embodiments of the test method described herein. In addition, retention cell 10 includes a CLK pin 20d coupled to receive clock pulses for shifting the data value (during non-test times) or the scan test pattern value (during test times) into and out of the retention cell, a RETAIN pin 20f coupled to receive a retain pulse to retain the data value or the scan test pattern value within the retention latch 14, a RESTORE pin 20e coupled to receive a restore pulse to restore the retained value to the functional latch 12, and a RESETn pin 20g coupled to logic block 16 for generating a functional reset for the functional latch 12. Furthermore, retention cell 10 includes an OUT pin 22 for forwarding the data value or the scan test pattern value out of the retention cell.

Multiplexer 18 is coupled to supply the data value on DATA pin 20a, or alternatively the scan test pattern value on TEST_IN pin 20b, to an input (D) of functional latch 12 depending on the state of the scan enable signal supplied to the select input of multiplexer 18 via SCAN_EN pin 20c. During non-test times, the scan enable signal is de-asserted (e.g., to logic low state) and the data value on DATA pin 20a is supplied to the input of functional latch 12. During test times, the scan enable signal is asserted (e.g., to a logic high state) and the scan test pattern value on TEST_IN pin 20b is supplied to the input of the functional latch 12. As used herein, the phrase "during test times" refers to any time during which a scan test is performed to test the state retention capabilities of, or to detect structural defects on, one or more retention cells provided on an IC. The phrase "during non-test times", therefore, refers to any time during which a scan test is not performed.

In the example retention cell 10 shown in FIG. 1, the output (Q) of functional latch 12 is coupled to an OUT pin 22 of the retention cell, and to a first input (D) of retention latch 14. RETAIN pin 20f is coupled to a second input (L) of retention latch 14. CLK pin 20d is coupled, via logic block 16, to the SET and CLR inputs of functional latch 12. RESTORE pin 20e is coupled, also via logic block 16, to the SET and CLR inputs of functional latch 12. Logic block 16 generally functions to decode the set and reset of functional latch 12 based on the retain, restore and functional reset of the design. Logic block 16 may comprise substantially any number and combination of logic gates, including AND, OR, NAND, NOR, XOR, XNOR and/or NOT gates, to achieve such functionality.

During both test and non-test times, CLK pin 20d may be pulsed to transfer the value at the output of multiplexer 18 to the input (D) of function latch 12 and/or to output such value via OUT pin 22 of retention cell 10. RETAIN pin 20f may be pulsed to retain the value (which is currently loaded within functional latch 12) within retention latch 14 during test times, and during non-test times when power is removed from circuitry/domains associated with the retention cell. RESTORE pin 20e may be pulsed to restore the retained value (i.e., the value retained within retention latch 14) to functional latch 12 during test times, and during non-test times when power is resupplied to the circuitry/domains.

In some embodiments, a plurality of retention cells may be coupled together in a serial scan chain. In other embodiments, a plurality of retention cells and non-retention cells may be couple together in a mixed scan chain. As used herein, non-retention cells may include flip-flops and/or latches that are not used to save state retention values, but are included on the IC as registers for storing information. Scan chains are generally provided on an IC chip to enable scan test patterns to be loaded into the scan chains for testing the retention cells contained therein. As described in more detail below, the output of each cell in the scan chain may be coupled to the input of the next consecutive cell, so that a scan test pattern provided to the first cell in the scan chain can propagate in a serial fashion through the scan chain.

Figure 2:
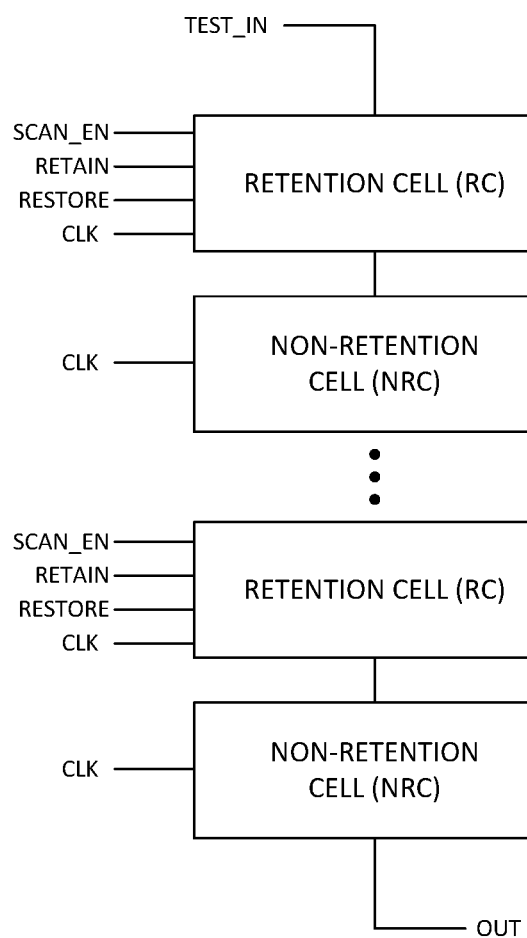
FIG. 2 is a block diagram illustrating a mixed scan chain of retention cells (RCs) and non-retention cells (NRCs)

FIG. 2 depicts one example of a mixed scan chain including a plurality of retention cells (RCs) and non-retention cells (NRCs). In the example embodiment shown in FIG. 2, retention cells and non-retention cells are serially coupled in an alternating fashion to generate a mixed scan chain of retention cells and non-retention cells. Although illustrated as such, it is not necessary to couple the retention and non-retention cells in an alternating fashion. For purposes of the present disclosure, a mixed scan chain may include any combination and any number of retention and non-retention cells, as long as the output of each cell is coupled to the input of the next consecutive cell.

In some embodiments, the retention cells (RCs) in the mixed scan chain may be identified and distinguished from the non-retention cells (NRCs). In one example, the retention cells (RCs) in the mixed scan chain may be identified from a list of cell types used for retention. For example, the Unified Power Format (UPF) 2.x (IEEE 1801) Specification is a power specification format used to partition IC designs into various power domains, specify isolation cells at power boundaries, specify retention cells for sequential logic, and many other power artifacts. In some embodiments, UPF commands may be executed to obtain a list of cell types used as retention cells, and using such list as a guide, an Automatic Test Pattern Generator (ATPG) tool performing a scan test may identify the retention cells included within the mixed scan chain. Unlike conventional test methods, which require retention and non-retention cells to be in separate scan chains, the identification step used in the test method described herein enables retention and non-retention cells to be mixed in the same scan chain. This optimizes the test logic area, as well as the time needed to perform a scan test compared to conventional test methods.

When a scan enable signal is asserted to enter a scan test mode, a scan test pattern is provided to the TEST_IN pin of the first cell in the scan chain and the CLK pin of each cell is pulsed a number of times to load the scan test pattern into the retention cells of the scan chain. A scan test pattern is a pattern or sequence of logic values, including logic 0 and logic 1 values. Although a particular scan test pattern of alternating 1's and 0's (e.g., '101010 . . . ' or '010101 . . . ') is used in the test method described below for detecting faults on one or more pins of one or more retention cells in the scan chain, other scan test patterns may be used to detect other structural defects and/or to test the state retention capability of the retention cells. After the scan test pattern is loaded into the retention cells of the scan chain and a scan test is performed, the CLK pin of each cell may again be pulsed a number of times to shift the scan test pattern out of the scan chain.

Conventional ATPG tools provide ATPG models for testing the retention and restore capabilities of state retention cells by providing scan test patterns and performing a state retention test. As noted above, state retention tests generally involve loading a scan test pattern into a scan chain of retention cells while power is supplied to the associated circuitry, removing power from the associated circuitry for a period of time, retaining the logic values loaded into the retention cells, performing a power up sequence to reapply power to the circuitry, restoring the retained logic values in the retention cells, unloading the scan chains, and comparing the unloaded values with the loaded values to test the retention and restore capabilities of state retention cells. Although conventional ATPG tools provide test methods for testing the functional behavior of retention cells, conventional ATPG models developed for such tools often fail to include, or provide accurate detection of, stuck-at faults on one or more pins of the retention cells.

As noted above, a "stuck-at fault" is an example of a structural defect on a pin that is shorted to (i.e., stuck at) another node or pin, thereby causing the shorted pin to be "stuck at" a particular logic value (e.g., a logic 1 or logic 0 value). If a RETAIN pin 20f of a retention cell 10 is "stuck-at 1," the retention latch 14 of the retention cell will retain or store each new value loaded into the retention cell via the DATA pin 20a or TEST_IN pin 20b. If a RESTORE pin 20e of a retention cell 10 is "stuck-at 0," the output of the functional latch 12 will be stuck at the previously retained value and cannot receive new values loaded into the retention cell via the DATA pin 20a or TEST_IN pin 20b. Failure to detect stuck-at faults on the RESTORE and RETAIN pins of the retention cells reduces the fault coverage of the ATPG model, and causes incorrect logic values to be output from the retention cells.

Figure 3:
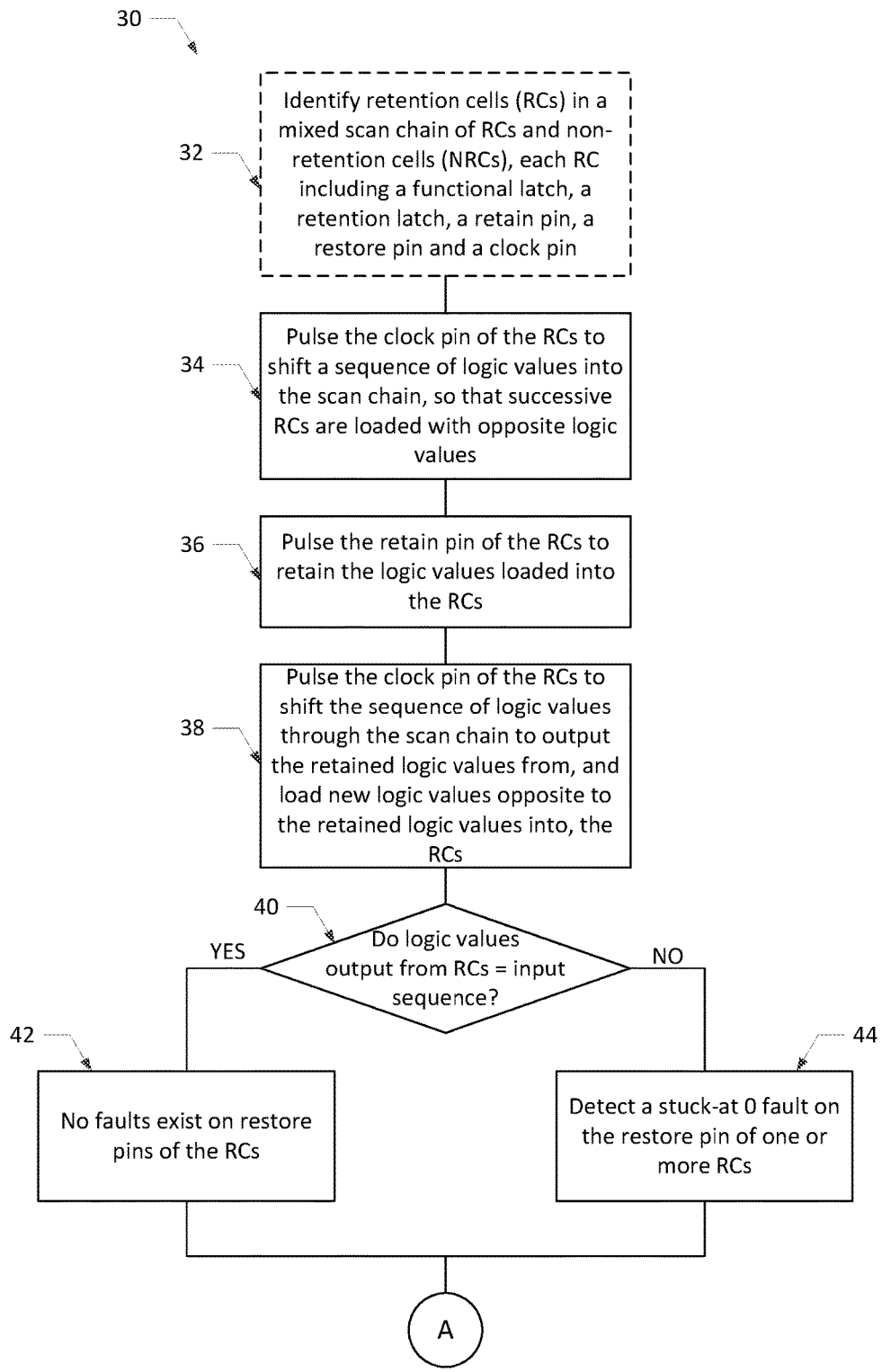
FIG. 3 is a flowchart diagram illustrating one embodiment of a method for testing retention cells included within a scan chain.
Figure 3:
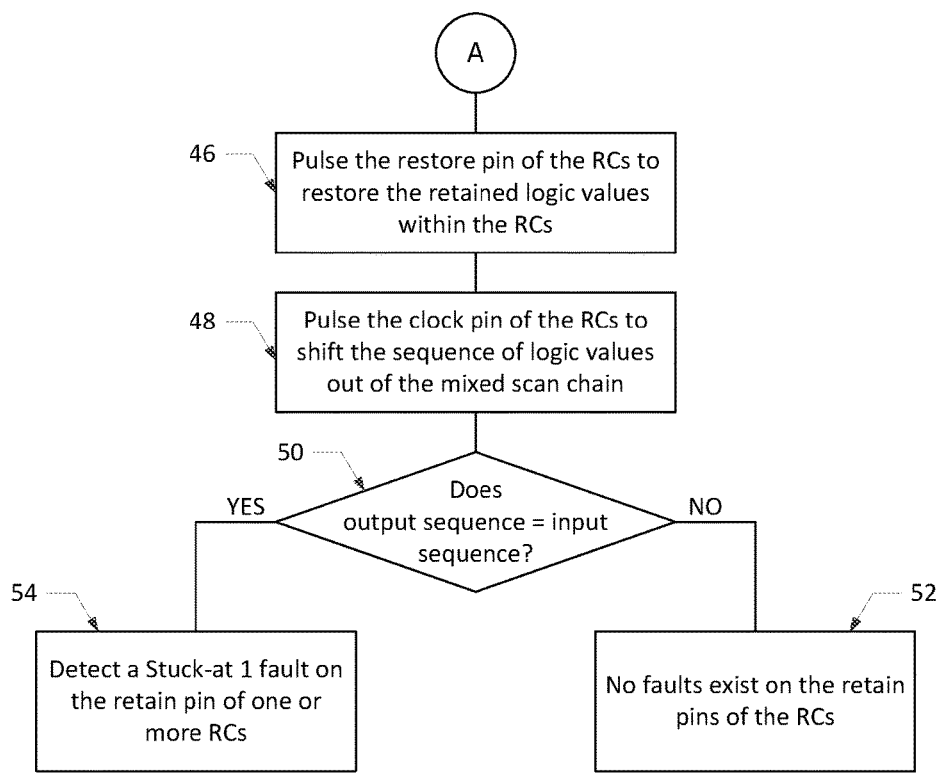
Figure 4:
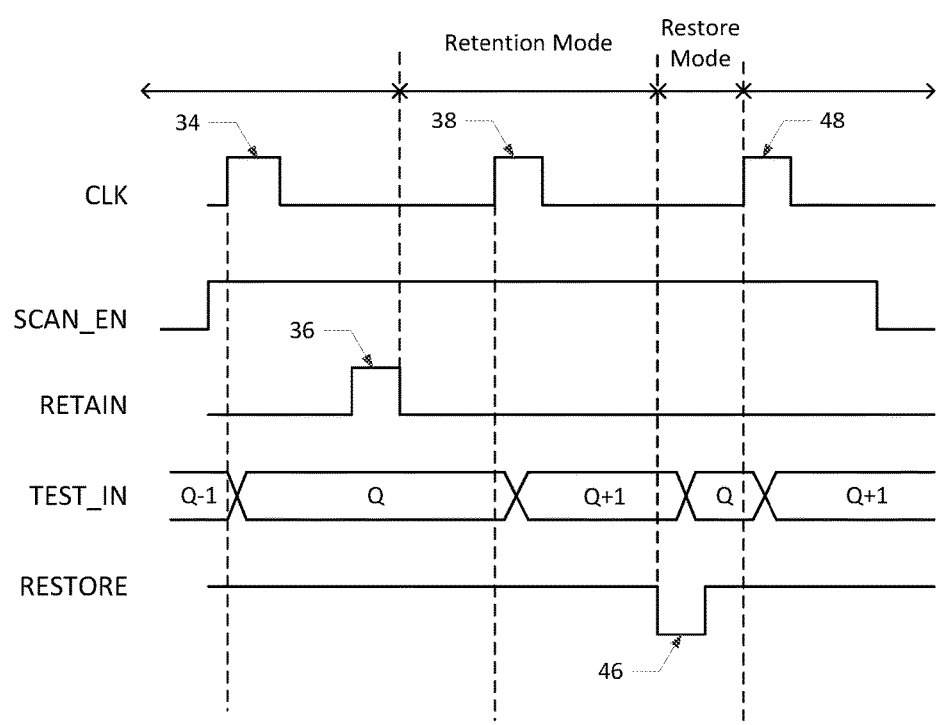
FIG. 4 is a timing diagram illustrating various signals supplied to a retention cell during the test method shown in FIG. 3.

FIG. 3 is a flowchart diagram depicting one embodiment of an improved test method 30 that can be utilized by an ATPG tool to accurately detect stuck-at 0 faults on the RESTORE pins and stuck-at 1 faults on the RETAIN pins of retention cells included within a scan chain. Although some retention cell designs may use a single pin for retention and restore, the test methods disclosed herein are preferably applied to retention cells having separate RETAIN and RESTORE pins, as shown in the retention cell 10 embodiment of FIG. 1. FIG. 4 is a timing diagram illustrating various signals supplied to a single retention cell during the test method 30 shown in FIG. 3. Reference will now be made to FIGS. 3 and 4 in describing the test method.

Before test method 30 begins, the scan enable signal supplied to the SCAN_EN pin of the retention cells may be asserted (e.g., to a logic high state, as shown in FIG. 4) to place the retention cells in a scan shift mode, and to forward the scan test pattern on TEST_IN pin 20b from multiplexer 18 to the D input of functional latch 12. As shown in FIG. 4, the retention cells remain in scan shift mode throughout the duration of the test method, so that logic values at the output of the retention cells can be compared with the input scan test pattern at each clock pulse step 34, 38 and 48 of the test method 30 shown in FIG. 3. The scan enable signal may be de-asserted (e.g., to a logic low value) once the test method is complete. Although not shown in FIG. 4, the reset signal supplied to the RESETn pin 20g may also be de-asserted (e.g., to a logic high state) before test method 30 begins, and may remain de-asserted throughout the test method.

In some embodiments, test method 30 may begin (in optional step 32) by identifying the retention cells in a mixed scan chain of retention cells (RCs) and non-retention cells (NRCs). In one example, a UPF list of cell types may be used to identify the retention cells and non-retention cells included within a mixed scan chain as described above. Although preferred in some embodiments, identification step 32 is illustrated in FIG. 3 as an optional step, which may not be performed in all embodiments of the method.

In other embodiments, test method 30 may begin by providing a scan test pattern (i.e., a sequence of logic values) to the TEST_IN pin of the first cell in the scan chain. In step 34, the CLK pin of the retention cells is pulsed to shift the scan test pattern into the scan chain. More specifically, a number of pulses is supplied to the CLK pin of the retention cells in step 34 to load the logic values of the scan test pattern into the functional latches of the retention cells. The number of clock pulses needed to load the scan test pattern into the scan chain may generally depend on the number of retention and non-retention cells included within the scan chain. In one embodiment, a scan test pattern of Q, Q+1, Q, Q+1 . . . (where Q and Q+1 represent opposite logic values) may be supplied to the scan chain, as shown in FIG. 4, so that successive retention cells are loaded with opposite logic values. For example, a scan test pattern of '101010 . . . ' or '010101 . . . ' may be loaded into the scan chain in step 34. In a mixed scan chain embodiment, the UPF list of cell types may be used to ensure that opposite logic values are loaded into successive retention cells.

In step 36, the RETAIN pin of the retention cells is pulsed to retain the logic values loaded into the retention cells. More specifically, a single pulse is supplied to the RETAIN pin of the retention cells to retain the logic values (which were received by the functional latches in step 34) within the retention latches of the retention cells. In the timing diagram shown in FIG. 4, pulsing the RETAIN pin in step 36 causes the retention cell to enter a retention mode. This should enable the Q logic value, which was loaded into the functional latch at clock pulse step 34, to be retained within the retention latch.

In step 38, the CLK pin of the retention cells is pulsed to shift the scan test pattern through the scan chain, so that previously retained logic values are output from the retention cells and new logic values, opposite to the retained logic values, are loaded into the retention cells. More specifically, one additional pulse is supplied to the CLK pin of the retention cells in step 38 to output the previously retained logic values from, and load logic values opposite to the retained logic values into, the functional latches of the retention cells. In the timing diagram shown in FIG. 4, pulsing the CLK pin in step 38 causes a Q+1 logic value to be loaded into the functional latch of the retention cells.

In some embodiments, test method 30 may perform a bit-by-bit comparison in step 40 between the logic values output from the retention cells in step 38 and the logic values shifted into the scan chain in step 34 to detect stuck-at 0 fault on the RESTORE pin of a retention cell. In some embodiments, each bit location of the scan test pattern corresponds to a different retention cell within the scan chain. In a mixed scan chain embodiment, bit locations corresponding to non-retention cells may be ignored in comparison 40. In some cases, test method 30 may determine that no faults exist on the RESTORE pins of the retention cells in step 42, if the logic values output from the retention cells match the logic values shifted into the scan chain at each bit location of the scan test pattern (YES branch of step 40). In other cases, test method 30 may detect a stuck-at 0 fault on a RESTORE pin of a retention cell in step 44, if the logic value output from the retention cell does not equal the logic value shifted into the scan chain at the bit location corresponding to that retention cell (NO branch of step 40).

In an alternative embodiment (see, FIG. 5b), test method 30 may perform a bit-by-bit comparison between the logic value at the output of the functional latch to the new logic value received via the TEST_IN pin at the input of the functional latch. As shown in FIG. 4, for example, pulsing the CLK pin in step 38 should cause each retention cell in the scan chain to output the logic value (e.g., Q) it received in step 34, and receive a new logic value (e.g., Q+1) opposite to the retained logic value, if a stuck-at 0 fault does not exist on the RESTORE pin. If the logic value at the output of a retention cell in step 38 is equal to the logic value loaded into the retention cell in step 34, a stuck-at 0 fault is detected on the RESTORE pin of the retention cell in step 44.

In step 46, the RESTORE pin of the retention cells is pulsed to restore the retained logic values within the retention cells. More specifically, a single pulse is supplied to the RESTORE pin of the retention cells to restore the logic values, which were retained within the retention latches in step 36, to the functional latches of the retention cells in step 46. In the timing diagram shown in FIG. 4, pulsing the RESTORE pin in step 46 causes the retention cell to enter a restore mode. This should cause the Q logic value retained within the retention latch to be restored to the functional latch.

In step 48, the CLK pin of the retention cells is pulsed to shift the scan test pattern out of the scan chain. More specifically, a number of pulses is supplied to the CLK pin of the retention cells to shift the entire scan test pattern out the scan chain. As before, the number of clock pulses needed to shift out the scan test pattern may generally depend on the number of retention and non-retention cells in the scan chain.

In some embodiments, test method 30 may perform a bit-by-bit comparison in step 50 between the scan test pattern shifted out of the scan chain and the scan test pattern shifted into the scan chain. In some embodiments, each bit location of the scan test pattern may correspond to a different retention cell in the scan chain. In a mixed scan chain embodiment, bit locations corresponding to non-retention cells may be ignored in comparison 50. In some cases, test method 30 may determine that no faults exist on the RETAIN pins of the retention cells in step 52, if the logic values shifted out of the scan chain and the logic values shifted into the scan chain are different (i.e., not equal) at each bit location of the scan test pattern (NO branch of step 50). In other cases, test method 30 may detect a stuck-at 1 fault on a RETAIN pin of a retention cell in step 54, if a logic value shifted out of the scan chain is equal to a logic value shifted into the scan chain at a bit location corresponding to that retention cell (YES branch of step 50).

In an alternative embodiment (see, FIG. 5c), test method 30 may perform a bit-by-bit comparison between the logic value at the OUT pin of the functional latch to the logic value received via the TEST_IN pin at the input of the functional latch. As shown in FIG. 4, for example, pulsing the CLK pin in step 48 should cause each retention cell in the scan chain to output the logic value (e.g., Q+1) it received when the clock pin was pulsed in step 38, if a stuck-at 1 fault does not exist on the RETAIN pin. If the logic value output from a retention cell in step 48 does not match the logic value it received in step 38, a stuck-at 1 fault is detected on the RETAIN pin of the retention cell in step 54.

Although not explicitly shown in FIGS. 3 and 4, the entirety of test method 30 is performed without removing power from the retention cells. Maintaining power to the retention cells represents one difference between test method 30 and conventional test methods, which remove and reapply power to the retention cells to test the retention and restore capabilities of the retention cells. Maintaining power to the retention cells enables the test method described herein to shift opposite logic values into the retention cells (in clock pulse step 38) while in retention mode, thereby enabling the disclosed test method to detect stuck-at 0 faults on the RESTORE pin of one or more retention cells in steps 40 and 44.

FIGS. 5a-c depict example logic values that may be provided at the TEST_IN and OUT pins of a plurality of retention cells at the first clock pulse step 34 (FIG. 5a), the second clock pulse step 38 (FIG. 5b) and the third clock pulse (FIG. 5c) shown in FIG. 3. While twelve (12) retention cells are illustrated in FIGS. 5a-c, it is noted that substantially any number of retention cells may be included within a scan chain. It is further noted that the logic values shown in FIGS. 5a-c correspond only to the retention cells included within the scan chain; logic values corresponding to non-retention cells in mixed scan chain embodiments are not shown in FIGS. 5a-c.

As shown in FIG. 5a, an example scan test pattern of '101010101010' may be loaded into retention cells 1 . . . 12 when the CLK pin of the retention cells is pulsed in step 34 to shift the scan test pattern into the scan chain. After the RETAIN pin is pulsed in step 36 to retain the logic values within the retention latches, an additional pulse is supplied to the CLK pin of the retention cells in step 38 to shift the scan test pattern through the scan chain. As shown in FIG. 5b, the clock pulse at step 38 should cause each retention cell 1 . . . 12 in the scan chain to provide the logic value it received at the TEST_IN pin in step 34 (FIG. 5a) to the OUT pin, and to receive a new opposite logic value at the TEST_IN pin. In some embodiments, a stuck-at 0 fault may be detected on the RESTORE pin of a retention cell, if the logic value at the OUT pin is equal to the new logic value provided to the TEST_IN pin of the retention cell. In the example shown in FIG. 5b, stuck-at 0 faults are detected on the RESTORE pins of retention cells 1 and 7.

After the RESTORE pin is pulsed in step 46 to restore the retained logic values within the functional latches of the retention cells, the CLK pin of the retention cells is pulsed in step 48 to shift the scan test pattern out of the scan chain. As shown in FIG. 5c, the clock pulse at step 48 should cause each retention cell in the scan chain to output the new logic value it received at the TEST_IN pin when the clock pin was pulsed in step 38. In some embodiments, a stuck-at 1 fault may be detected on the RETAIN pin of a retention cell, if the logic value at the OUT pin does not match the logic value at the TEST_IN pin of the retention cell. In the example shown in FIG. 5c, stuck-at 1 faults are detected on the RETAIN pins of retention cells 3, 6 and 11.

The test methods shown in FIGS. 3, 4 and 5 and described above improve upon conventional test methods in a number of ways. Whereas conventional ATPG models fail to do so, the test methods described herein provide an accurate method for detecting stuck-at faults on the RETAIN and RESTORE pins of the retention cells. In some embodiments, the test methods described herein may be used to increase ATPG stuck-at fault coverage by approximately 7% per retention cell. In an example IC chip comprised of 35% retention cells and 65% non-retention cells, the test methods described herein may increase ATPG stuck-at fault coverage by approximately 2.6% per chip. In some cases, the improved fault coverage provided by the test methods described herein may enable an IC chip design to meet the 98% stuck-at coverage target defined by the AES standard. In addition to improving stuck-at coverage, the test methods described herein also consume less power than conventional state retention tests, since power to the IC is maintained during the disclosed test method and not cycled on and off, as in state retention tests. Finally, the disclosed test methods do not require retention cells and non-retention cells to be included in separate scan chains. Instead, test time is optimized by combining retention and non-retention cells in a mixed scan chain and providing an identification step (step 32) to identify the retention cells. Mixing retention and non-retention cells in a mixed scan chain provides further advantages of reducing test logic area and not requiring extra hardware to perform the tests described herein.

In general, the test methods disclosed herein may be implemented as program instructions stored within a non-transitory, computer-readable storage medium and executed by a processing device. In some embodiments, the processing device may reside within an ATPG tool, and the computer-readable storage medium may reside inside or outside of the ATPG tool. Regardless of whether an internal or external computer-readable storage medium is provided, the processing device included within the ATPG tool may be configured to access and execute the program instructions stored therein to perform the test methods disclosed herein.

Figure 6:
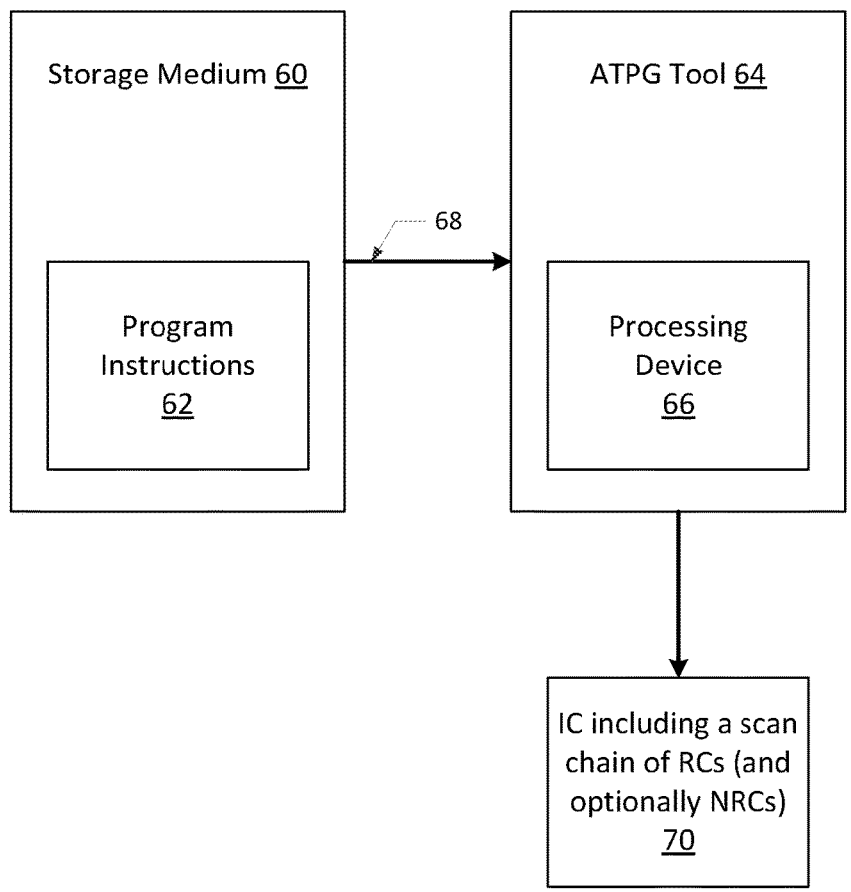
FIG. 6 is a block diagram illustrating a computer-readable storage medium having program instructions stored thereon, and an Automatic Test Pattern Generation (ATPG) tool coupled to the computer-readable storage medium for receiving the program instructions.

FIG. 6 is a block diagram illustrating one embodiment of a storage medium 60 having program instructions 62 stored thereon, and an Automatic Test Pattern Generation (ATPG) tool 64, which is coupled to the storage medium for receiving program instructions 62. As shown in FIG. 6, ATPG tool 64 may generally include a processing device 66 configured to execute program instructions 62 to perform embodiments of the disclosed test method on an integrated circuit (IC) 70 comprising a scan chain of retention cells (and optionally, a mixed scan chain of retention and non-retention cells).

Storage medium 60 may be substantially any non-transitory computer-readable storage medium including, but not limited to, random access memory (RAM), read only memory (ROM) nonvolatile RAM (NVRAM), a hard disk drive, a FLASH drive, a memory card, or an optical disc drive. In some embodiments, storage medium 60 may reside within a computing device (such as a desktop computer, a laptop computer or a server), which is physically located external to ATPG tool 64, yet coupled to the ATPG tool via a wired or wireless communication medium 68. In other embodiments, storage medium 60 may reside within ATPG tool 64 as internal storage.

Program instructions 62 may be written using any suitable programming language including, but not limited to, Standard Test Interface Language (STIL), Waveform Generation Language (WGL), and Teradyne ATP formats. Regardless of the particular programming language used, programming instructions 62 may generally include first program instructions executable for pulsing the CLK pin of the retention cells to shift a sequence of logic values into the scan chain, so that successive retention cells are loaded with opposite logic values; second program instructions executable for pulsing the RETAIN pin of the retention cells to retain the logic values loaded into the retention cells; third program instructions executable for pulsing the CLK pin of the retention cells to shift the sequence of logic values through the scan chain, so that retained logic values are output from the retention cells and logic values opposite to the retained logic values are loaded into the retention cells; fourth program instructions executable for pulsing the RESTORE pin of the retention cells to restore the retained logic values within the retention cells; fifth program instructions executable for pulsing the CLK pin of the retention cells to shift the sequence of logic values out of the scan chain; sixth program instructions executable for comparing the sequence of logic values shifted out of the scan chain with the sequence of logic values shifted into the scan chain; and seventh program instructions executable for detecting a fault on the RETAIN pin of one or more retention cells if the logic value shifted out of the scan chain is equal to the logic value shifted into the scan chain at the bit location corresponding to the retention cell. In some embodiments, programming instructions 62 may further include eighth program instructions executable for comparing the logic values, which were output from the retention cells upon execution of the third program instructions, with the logic values shifted into the scan chain at each bit location; and ninth program instructions executable for detecting a stuck-at 0 fault on the RESTORE pin of a retention cell if the logic value output from the retention cell does not equal the logic value shifted into the scan chain at the bit location corresponding to the retention cell.

ATPG tool 64 may be any Automatic Test Pattern Generator tool known in the art. One example of a conventional ATPG tool is the Tessent FastScan™ provided by Mentor Graphics Corporation of Wilsonville, Oreg. ATPG tools rely on dedicated ATPG libraries to generate the scan test patterns used to test retention cells and other modules of IC designs. These dedicated libraries include ATPG models for various modules of the IC design, including models for testing retention cells in scan chains. ATPG tool 64 executes the program instructions 62 received from the storage medium 60 to generate scan test patterns, which can then be used to accurately detect stuck-at faults on the RETAIN and RESTORE pins of retention cells included within IC 70 using the test methods disclosed herein. The processing device 66 included within ATPG tool 64 may include, for example, a microprocessor having one or more processing cores and/or other programmable circuitry configured to execute program instructions 62 to perform the operations, tasks, functions, or methodologies described herein.

It is further noted that the functional blocks, components, systems, devices, and/or circuitry described herein, including the ATPG tool 64 and/or its components such as the processing device 66, can be implemented using hardware, software, or a combination of hardware and software. For example, one or more programmable integrated circuits can be used that are programmed to perform the functions, tasks, methods, actions, and/or other operational features described herein for the disclosed embodiments. The one or more programmable integrated circuits can include, for example, one or more processors and/or PLDs (programmable logic devices). The one or more processors can be, for example, one or more central processing units (CPUs), controllers, microcontrollers, microprocessors, hardware accelerators, ASICs (application specific integrated circuit), and/or other integrated processing devices. The one or more PLDs can be, for example, one or more CPLDs (complex programmable logic devices), FPGAs (field programmable gate arrays), PLAs (programmable logic array), reconfigurable logic circuits, and/or other integrated logic devices. Further, the programmable integrated circuits, including the one or more processors, can be configured to execute software, firmware, code, and/or other program instructions that are embodied in one or more non-transitory tangible computer-readable storage mediums to perform the functions, tasks, methods, actions, and/or other operational features described herein for the disclosed embodiments. The programmable integrated circuits, including the one or more PLDs, can also be programmed using logic code, logic definitions, hardware description languages, configuration files, and/or other logic instructions that are embodied in one or more non-transitory tangible computer-readable storage mediums to perform the functions, tasks, methods, actions, and/or other operational features described herein for the disclosed embodiments. In addition, the one or more non-transitory tangible computer-readable storage mediums can include, for example, one or more data storage devices, memory devices, flash memories, random access memories, read only memories, programmable memory devices, reprogrammable storage devices, hard drives, floppy disks, DVDs, CD-ROMs, and/or any other non-transitory tangible computer-readable storage mediums. Other variations can also be implemented while still taking advantage of the techniques described herein.

It also will be appreciated to those skilled in the art having the benefit of this disclosure that this disclosure is believed to provide embodiments of improved methods for detecting stuck-at faults on the RETAIN and RESTORE pins of retention cells. A computer-readable storage medium comprising program instructions executable for performing the disclosed test methods is also provided herein. It is to be understood that the various embodiments of test methods, program instructions and storage media shown and described herein are to be taken as presently preferred embodiments. Further modifications and alternative embodiments of various aspects of the disclosure will be apparent to those skilled in the art in view of this description. Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. A method for testing retention cells included within a scan chain, wherein each retention cell comprises a functional latch, a retention latch, a retain pin, a restore pin and a clock pin, and wherein the method comprises:
  pulsing the clock pin of the retention cells to shift a sequence of logic values into the scan chain, so that successive retention cells are loaded with opposite logic values;
  pulsing the retain pin of the retention cells to retain the logic values loaded into the retention cells;
  pulsing the clock pin of the retention cells to shift the sequence of logic values through the scan chain, so that the retained logic values are output from the retention cells and logic values opposite to the retained logic values are loaded into the retention cells;
  pulsing the restore pin of the retention cells to restore the retained logic values within the retention cells;
  pulsing the clock pin of the retention cells to shift the sequence of logic values out of the scan chain;
  comparing the sequence of logic values shifted out of the scan chain with the sequence of logic values shifted into the scan chain; and
  detecting a fault on the retain pin of one or more retention cells based on said comparison.

2. The method as recited in claim 1, wherein the scan chain further includes non-retention cells, and wherein prior to said shifting a sequence of logic values into the scan chain, the method comprises identifying the retention cells in the scan chain.

3. The method as recited in claim 1, wherein said pulsing the clock pin of the retention cells to shift a sequence of logic values into the scan chain comprises supplying a number of pulses to the clock pins of the retention cells to load logic values within the functional latches of all retention cells in the scan chain.

4. The method as recited in claim 1, wherein said pulsing the retain pin of the retention cells comprises supplying a pulse to the retain pins of the retention cells to retain the logic values within the retention latches of the retention cells.

5. The method as recited in claim 1, wherein said pulsing the clock pin of the retention cells to shift the sequence of logic values through the scan chain comprises supplying one additional pulse to the clock pins of the retention cells to output the retained logic values from, and load logic values opposite to the retained logic values into, the functional latches of the retention cells.

6. The method as recited in claim 1, wherein said pulsing the restore pin of the retention cells comprises supplying a pulse to the restore pins of the retention cells to restore the retained logic values within the functional latches of the retention cells.

7. The method as recited in claim 1, wherein said pulsing the clock pin of the retention cells to shift the sequence of logic values out of the scan chain comprises supplying a number of pulses to the clock pins of the retention cells to shift the sequence of logic values out the scan chain.

8. The method as recited in claim 1, wherein each bit location within the sequence of logic values corresponds to a different retention cell within the scan chain.

9. The method as recited in claim 8, wherein:
  said comparing comprises comparing the logic values shifted out of the scan chain with the logic values shifted into the scan chain at each bit location; and
  said detecting comprises detecting a stuck-at 1 fault on the retain pin of a retention cell if the logic value shifted out of the scan chain is equal to the logic value shifted into the scan chain at the bit location corresponding to the retention cell.

10. The method as recited in claim 8, wherein after the step of pulsing the clock pin of the retention cells to shift the sequence of logic values through the scan chain, and before the step of pulsing the restore pin of the retention cells, the method further comprises:
  comparing the logic values output from the retention cells with the logic values shifted into the scan chain at each bit location; and
  detecting a stuck-at 0 fault on the restore pin of a retention cell if the logic value output from the retention cell does not equal the logic value shifted into the scan chain at the bit location corresponding to the retention cell.

11. A computer-readable storage medium having a plurality of program instructions stored thereon, wherein the plurality of program instructions are executable by a processing device for testing retentions cells included within a scan chain, wherein each retention cell comprises a functional latch, a retention latch, a retain pin, a restore pin and a clock pin, and wherein the plurality of program instructions comprise:
  first program instructions executable for pulsing the clock pin of the retention cells to shift a sequence of logic values into the scan chain, so that successive retention cells are loaded with opposite logic values;
  second program instructions executable for pulsing the retain pin of the retention cells to retain the logic values loaded into the retention cells;
  third program instructions executable for pulsing the clock pin of the retention cells to shift the sequence of logic values through the scan chain, so that the retained logic values are output from the retention cells and logic values opposite to the retained logic values are loaded into the retention cells;
  fourth program instructions executable for pulsing the restore pin of the retention cells to restore the retained logic values within the retention cells;
  fifth program instructions executable for pulsing the clock pin of the retention cells to shift the sequence of logic values out of the scan chain;
  sixth program instructions executable for comparing the sequence of logic values shifted out of the scan chain with the sequence of logic values shifted into the scan chain; and
  seventh program instructions executable for detecting a fault on the retain pin of one or more retention cells based on said comparison.

12. The computer-readable storage medium as recited in claim 11, wherein said first program instructions comprise one or more program instructions executable for supplying a number of pulses to the clock pins of the retention cells to load logic values within the functional latches of all retention cells in the scan chain.

13. The computer-readable storage medium as recited in claim 11, wherein said second program instructions comprise one or more program instructions executable for supplying a pulse to the retain pins of the retention cells to retain the logic values within the retention latches of the retention cells.

14. The computer-readable storage medium as recited in claim 11, wherein said third program instructions comprise one or more program instructions executable for supplying one additional pulse to the clock pins of the retention cells to output the retained logic values from, and load logic values opposite to the retained logic values into, the functional latches of the retention cells.

15. The computer-readable storage medium as recited in claim 11, wherein said fourth program instructions comprise one or more program instructions executable for supplying a pulse to the restore pins of the retention cells to restore the retained logic values within the functional latches of the retention cells.

16. The computer-readable storage medium as recited in claim 11, wherein said fifth program instructions comprise one or more program instructions executable for supplying a number of pulses to the clock pins of the retention cells to shift the sequence of logic values out the scan chain.

17. The computer-readable storage medium as recited in claim 11, wherein each bit location within the sequence of logic values corresponds to a different retention cell within the scan chain.

18. The computer-readable storage medium as recited in claim 17, wherein:
   said sixth program instructions comprise one or more program instructions executable for comparing the logic values shifted out of the scan chain with the logic values shifted into the scan chain at each bit location; and
   said seventh program instructions comprise one or more program instructions executable for detecting a stuck-at 1 fault on the retain pin of a retention cell if the logic value shifted out of the scan chain is equal to the logic value shifted into the scan chain at the bit location corresponding to the retention cell.

19. The computer-readable storage medium as recited in claim 17, further comprising:
   eighth program instructions executable for comparing the logic values, which are output from the retention cells upon execution of the third program instructions, with the logic values shifted into the scan chain at each bit location; and
   ninth program instructions executable for detecting a stuck-at 0 fault on the restore pin of a retention cell if the logic value output from the retention cell does not equal the logic value shifted into the scan chain at the bit location corresponding to the retention cell.

20. The computer-readable storage medium as recited in claim 11, wherein the computer-readable storage medium is coupled for transmitting the plurality of program instructions to an automatic test pattern generator (ATPG) tool, and wherein the ATPG tool comprises the processing device, which is configured to execute the plurality of program instructions for testing the retention cells.

* * * * *